United States Patent
Cheng et al.

(10) Patent No.: US 8,546,209 B1
(45) Date of Patent: Oct. 1, 2013

(54) REPLACEMENT METAL GATE PROCESSING WITH REDUCED INTERLEVEL DIELECTRIC LAYER ETCH RATE

(75) Inventors: Kangguo Cheng, Schenectady, NY (US); Junli Wang, Singerlands, NY (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/524,576

(22) Filed: Jun. 15, 2012

(51) Int. Cl.
*H01L 21/338* (2006.01)

(52) U.S. Cl.
USPC ........... 438/183; 438/798; 438/378; 438/705; 438/151; 257/E21.434; 257/E21.444

(58) Field of Classification Search
USPC .................. 438/183, 275, 279, 624–648, 798, 438/378, 705, 287, 151, 711, 777; 257/27, 257/192, 272, E51.006, E29.127, E051, E21.453, 257/E21.146, E21.269–E21.274, E21.444, 257/E21.434
See application file for complete search history.

(56) References Cited

U.S. PATENT DOCUMENTS

| | | | |
|---|---|---|---|
| 5,869,394 A | 2/1999 | Chen et al. | |
| 6,331,227 B1 | 12/2001 | Dykstra et al. | |
| 6,607,950 B2 * | 8/2003 | Henson et al. | 438/197 |
| 6,624,081 B2 | 9/2003 | Dykstra et al. | |
| 6,646,277 B2 | 11/2003 | Mack et al. | |
| 7,071,122 B2 | 7/2006 | Saenger et al. | |
| 7,071,126 B2 | 7/2006 | Johnston et al. | |
| 7,115,511 B2 | 10/2006 | Hautala | |
| 7,138,308 B2 * | 11/2006 | Cheng et al. | 438/197 |
| 7,173,252 B2 | 2/2007 | Mack | |
| 7,186,992 B2 | 3/2007 | Nickel | |
| 7,405,152 B2 | 7/2008 | Gambino et al. | |
| 7,504,135 B2 | 3/2009 | Nickel | |
| 7,696,495 B2 | 4/2010 | Mack et al. | |
| 7,968,422 B2 | 6/2011 | Hautala | |
| 7,982,196 B2 * | 7/2011 | Hautala et al. | 250/492.21 |
| 8,227,874 B2 * | 7/2012 | Adkisson et al. | 257/411 |
| 8,288,271 B2 | 10/2012 | Akinmade Yusuff et al. | |
| 2002/0016079 A1 | 2/2002 | Dykstra et al. | |
| 2002/0130275 A1 | 9/2002 | Mack et al. | |
| 2004/0137733 A1 | 7/2004 | Hautala | |

(Continued)

OTHER PUBLICATIONS

R. MacCrimmon, et al., "Gas Cluster Ion Beam Infusion Processing of Semiconductors," Nuclear Instruments and Methods in Physics Research Section B: Beam Interactions with Materials and Atoms, vol. 241, Nos. 1-4, Dec. 2005, pp. 641-644.

(Continued)

*Primary Examiner* — Jarrett Stark
*Assistant Examiner* — Bitew Dinke
(74) *Attorney, Agent, or Firm* — Cantor Colburn LLP; Vazken Alexanian

(57) ABSTRACT

A method of forming a semiconductor device structure includes forming an interlevel dielectric (ILD) layer over a semiconductor substrate and a dummy transistor gate structure formed on the substrate; infusing a shallow gas cluster ion beam (GCIB) layer in a top portion of the ILD layer; and removing at least one layer from the dummy transistor gate structure, wherein the at least one layer comprises a same material as the ILD layer and wherein the GCIB layer has a slower etch rate with respect to the ILD layer.

20 Claims, 8 Drawing Sheets

(56) References Cited

U.S. PATENT DOCUMENTS

| | | | |
|---|---|---|---|
| 2006/0292762 A1* | 12/2006 | Borland et al. | 438/151 |
| 2007/0184656 A1* | 8/2007 | Sherman et al. | 438/687 |
| 2007/0210366 A1 | 9/2007 | Sandhu et al. | |
| 2007/0224824 A1* | 9/2007 | Chen et al. | 438/700 |
| 2008/0076191 A1 | 3/2008 | Hall et al. | |
| 2008/0090402 A1 | 4/2008 | Bonilla et al. | |
| 2008/0261393 A1 | 10/2008 | Gambino et al. | |
| 2009/0047768 A1* | 2/2009 | Jain | 438/306 |
| 2009/0084672 A1 | 4/2009 | MacCrimmon et al. | |
| 2009/0084759 A1 | 4/2009 | MacCrimmon et al. | |
| 2009/0084977 A1 | 4/2009 | Mack et al. | |
| 2009/0314963 A1* | 12/2009 | Hautala | 250/492.21 |
| 2010/0087056 A1* | 4/2010 | Chung et al. | 438/585 |
| 2010/0193472 A1 | 8/2010 | Tabat et al. | |
| 2010/0193898 A1 | 8/2010 | Hautala et al. | |
| 2010/0227142 A1 | 9/2010 | Hautala et al. | |
| 2010/0243919 A1* | 9/2010 | Hautala et al. | 250/492.3 |
| 2010/0311231 A1* | 12/2010 | Thei et al. | 438/587 |
| 2011/0174770 A1* | 7/2011 | Hautala | 216/13 |
| 2006/0172514 A1 | 9/2011 | Nitta et al. | |
| 2011/0266466 A1 | 11/2011 | Hautala et al. | |
| 2011/0312180 A1* | 12/2011 | Wang | 438/692 |
| 2012/0264281 A1* | 10/2012 | Chen et al. | 438/591 |
| 2012/0326230 A1* | 12/2012 | Cheng et al. | 257/347 |
| 2013/0115773 A1* | 5/2013 | Pal et al. | 438/697 |

OTHER PUBLICATIONS

S. V. Nguyen, "High-density plasma chemical vapor deposition of silicon-based dielectric films for integrated circuits," IBM Journal of Research and Development, vol. 43, No. 1-2, Jan. 1999, pp. 109-126.

I. Yamada, et al., "Gas Cluster Ion Beam Processing for ULSI Fabrication," J. Material Resources Society Symposium Proceedings, vol. 427, 1996, pp. 265-274.

\* cited by examiner

US 8,546,209 B1

REPLACEMENT METAL GATE PROCESSING WITH REDUCED INTERLEVEL DIELECTRIC LAYER ETCH RATE

BACKGROUND

The present invention relates generally to semiconductor device manufacturing and, more particularly, to implementing replacement metal gate processing with a reduced interlevel dielectric layer (ILD) etch rate.

Field effect transistors (FETs) are widely used in the electronics industry for switching, amplification, filtering, and other tasks related to both analog and digital electrical signals. Most common among these are metal-oxide-semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NFET and PFET) FETs are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

Continuing trends in semiconductor device manufacturing include reduction in electrical device feature sizes (i.e., scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling of electrons through the thin gate dielectric.

Accordingly, recent MOS and CMOS transistor scaling efforts have focused on high-k dielectric materials having dielectric constants greater than that of $SiO_2$ (e.g., greater than about 3.9). High-k dielectric materials can be formed in a thicker layer than scaled $SiO_2$, and yet still produce equivalent field effect performance. The relative electrical performance of such high-k dielectric materials is often expressed in terms equivalent oxide thickness (EOT), since the high-k material layer may be thicker, while still providing the equivalent electrical effect of a much thinner layer of $SiO_2$. Because the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

SUMMARY

In one aspect, a method of forming a semiconductor device structure includes forming an interlevel dielectric (ILD) layer over a semiconductor substrate and a dummy transistor gate structure formed on the substrate; infusing a shallow gas cluster ion beam (GCIB) layer in a top portion of the ILD layer; and removing at least one layer from the dummy transistor gate structure, wherein the at least one layer comprises a same material as the ILD layer and wherein the GCIB layer has a slower etch rate with respect to the ILD layer.

In another aspect, a method for forming a field effect transistor includes forming a dummy gate structure over a semiconductor substrate, the dummy gate structure having sidewall spacers disposed thereon; forming source and drain regions in the substrate, adjacent the sidewall spacers; forming an interlevel dielectric (ILD) layer over a semiconductor substrate and a dummy gate structure formed on the substrate; infusing a shallow gas cluster ion beam (GCIB) layer in a top portion of the ILD layer; and removing at least one layer from the dummy transistor gate structure, wherein the at least one layer comprises a same material as the ILD layer and wherein the GCIB layer has a slower etch rate with respect to the ILD layer.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
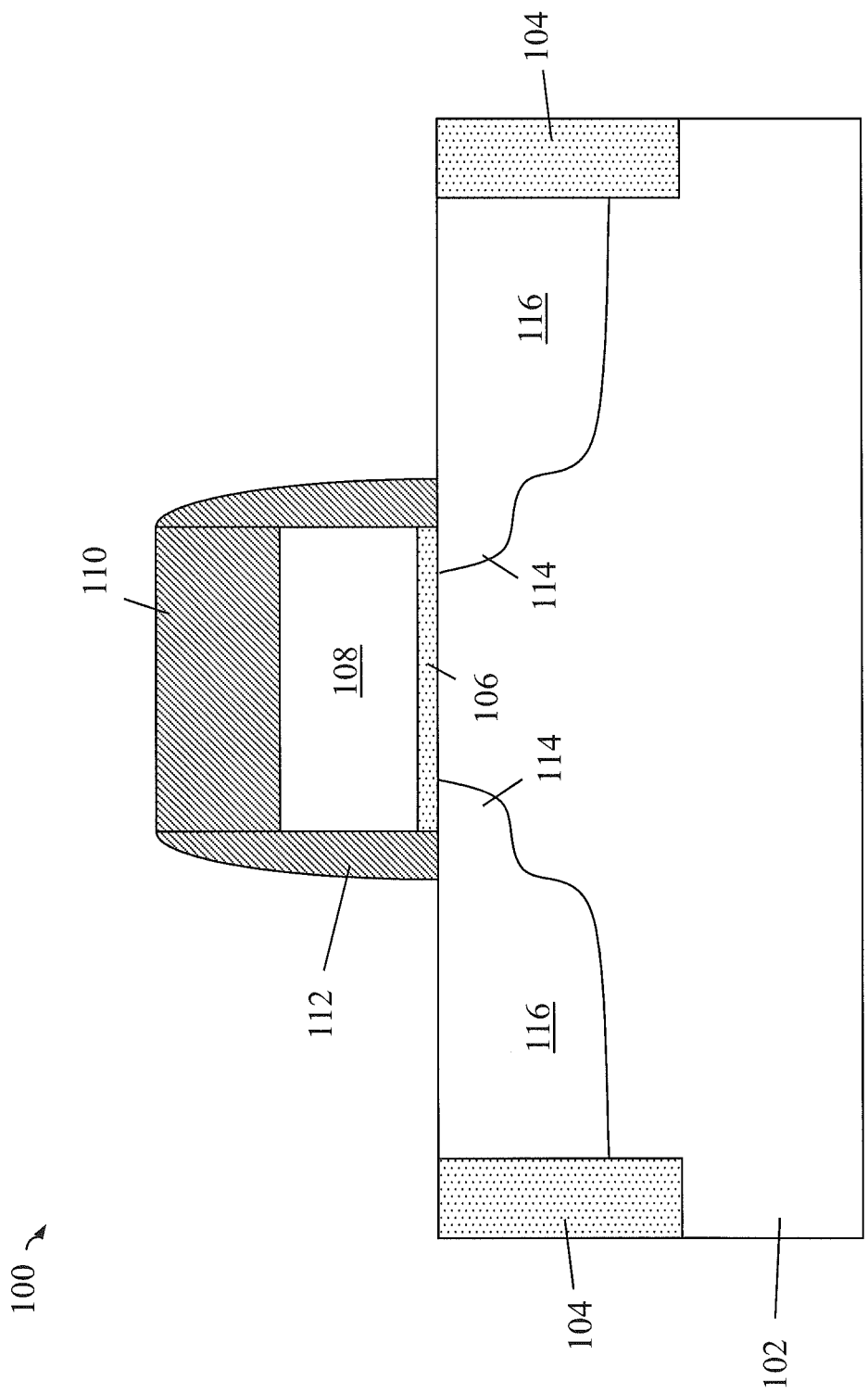
FIG. 1 is a cross sectional view of a processing stage of a high-K, metal gate (HKMG) transistor device using a replacement gate (gate last) technique.

With respect to high-k metal gate (HKMG) technology, the two main approaches for introducing a metal gate into the standard CMOS process flow are a "gate first" process or a "gate last" process. The latter is also referred to as a "replacement gate" or replacement metal gate (RMG) process. In a gate first process, high-k dielectric and metal processing is completed prior to polysilicon gate deposition. The metal gate material is subtractively etched along with the polysilicon gate material prior to source and drain formation.

The RMG process architecture, on the other hand, avoids the problems of workfunction material stability seen in the gate first architecture. Here, a dummy gate structure is used to self-align the source and drain implant and anneals, followed by stripping out the dummy gate materials and replacing them with the high-k and metal gate materials. Although this process is more complex than the gate first technique, advantages of a replacement gate flow include the use of separate PMOS and NMOS metals for work function optimization. In addition, the two metals are not exposed to high temperatures, simplifying material selection. Further, the polysilicon gate removal can actually be used to enhance strain techniques, thereby increasing drive currents.

In current replacement metal gate (RMG) processing, an ILD oxide is typically used to facilitate the dummy gate removal process after the source/drain and source/drain extensions are defined with the dummy gate in place. In this regard, an ILD oxide (which is deposited oxide) has a high HF (hydrofluoric acid) etch rate. Due to the high etch rate of ILD oxide, certain HF processing operations during dummy gate stack removal (e.g., HF precleaning before dummy poly removal, as well as HF etching to remove dummy gate oxide) cause recessing/loss of ILD material, which in turn results in variations in the final metal gate height across the wafer. Another issue may be excess metal gate fill material that does not get removed during planarization, which can in turn lead to device shorting.

One possible way to reduce the etch rate of a deposited oxide is by high temperature annealing (i.e., a densification anneal). However, such a high temperature anneal is incompatible with CMOS flow because it will cause excessive dopant diffusion. Another technique may be to perform an ion implantation of a material such as silicon to increase the etch rate of the $SiO_2$. Here, however, the depth of such an ion implantation is difficult to precisely control. As a result, undesired dopant atoms may reach locations such as the dummy polysilicon in the gate stack and/or even the source/drain diffusion regions of the substrate.

Accordingly, the exemplary embodiments disclosed herein address the above described problems by improving the etch resistivity of the deposited ILD oxide, but without the side effects of a high temperature, dopant diffusing process or a high energy ion implantation process. More specifically, the etch rate of ILD oxide is reduced by a low temperature process, namely a gas cluster ion beam (GCIB) implantation process.

Referring initially to FIG. 1, there is shown a cross sectional view of a processing stage of a high-K, metal gate (HKMG) transistor device 100 using a replacement gate (gate last) technique. The transistor device 100 includes semiconductor substrate 102 having shallow trench isolation (STI) regions 104 formed therein. The semiconductor substrate 102 includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Where the semiconductor material of the semiconductor substrate 102 is a single crystalline silicon-containing semiconductor material, the single crystalline silicon-containing semiconductor material may be selected from single crystalline silicon, a single crystalline silicon carbon alloy, a single crystalline silicon germanium alloy, and a single crystalline silicon germanium carbon alloy.

The semiconductor material of the semiconductor substrate 102 may be appropriately doped either with p-type dopant atoms or with n-type dopant atoms. The dopant concentration of the semiconductor substrate 102 may range from about $1.0 \times 10^{15}$ atoms/$cm^3$ to about $1.0 \times 10^{19}$ atoms/$cm^3$, and more specifically from about $1.0 \times 10^{16}$ atoms/$cm^3$ to about $3.0 \times 10^{18}$ atoms/$cm^3$, although lesser and greater dopant concentrations are contemplated herein also. In addition, the semiconductor substrate 102 may be a bulk substrate, a semiconductor-on-insulator or silicon-on-insulator (SOI) substrate, a hybrid substrate, or a finFET substrate.

The STI regions 104 may include an oxide material and be formed by any techniques known in the art, such as by patterning/etching/deposition, implantation, etc. The specific point in processing depicted in FIG. 1 is following dummy gate stack deposition, pattering, sidewall spacer formation, and source/drain region and extension implant. Thus, FIG. 1 further illustrates a dummy gate stack formed over the substrate 102, including a dummy gate oxide layer 106, a dummy polysilicon layer 108 on the dummy gate oxide layer 106, and a dummy nitride cap layer 110 on the dummy polysilicon layer 108. In addition, gate sidewall spacers 112 (e.g., nitride) are formed adjacent the dummy gate stack.

In accordance with a replacement gate process flow, the definition of the patterned dummy gate stack allows for source and drain extension region implantation, as shown at 114. Once the gate sidewall spacers 112 are in place, the main source and drain extension regions 116 can then be implanted as well. It should be appreciated that, in addition to the specific structures depicted in the embodiment of FIG. 1, the source/drain regions 116 may also have embedded source/drain stressor layers and/or may comprised raised source/drain for stress enhancement, carrier mobility and/or resistivity reduction purposes (not shown).

Figure 2:
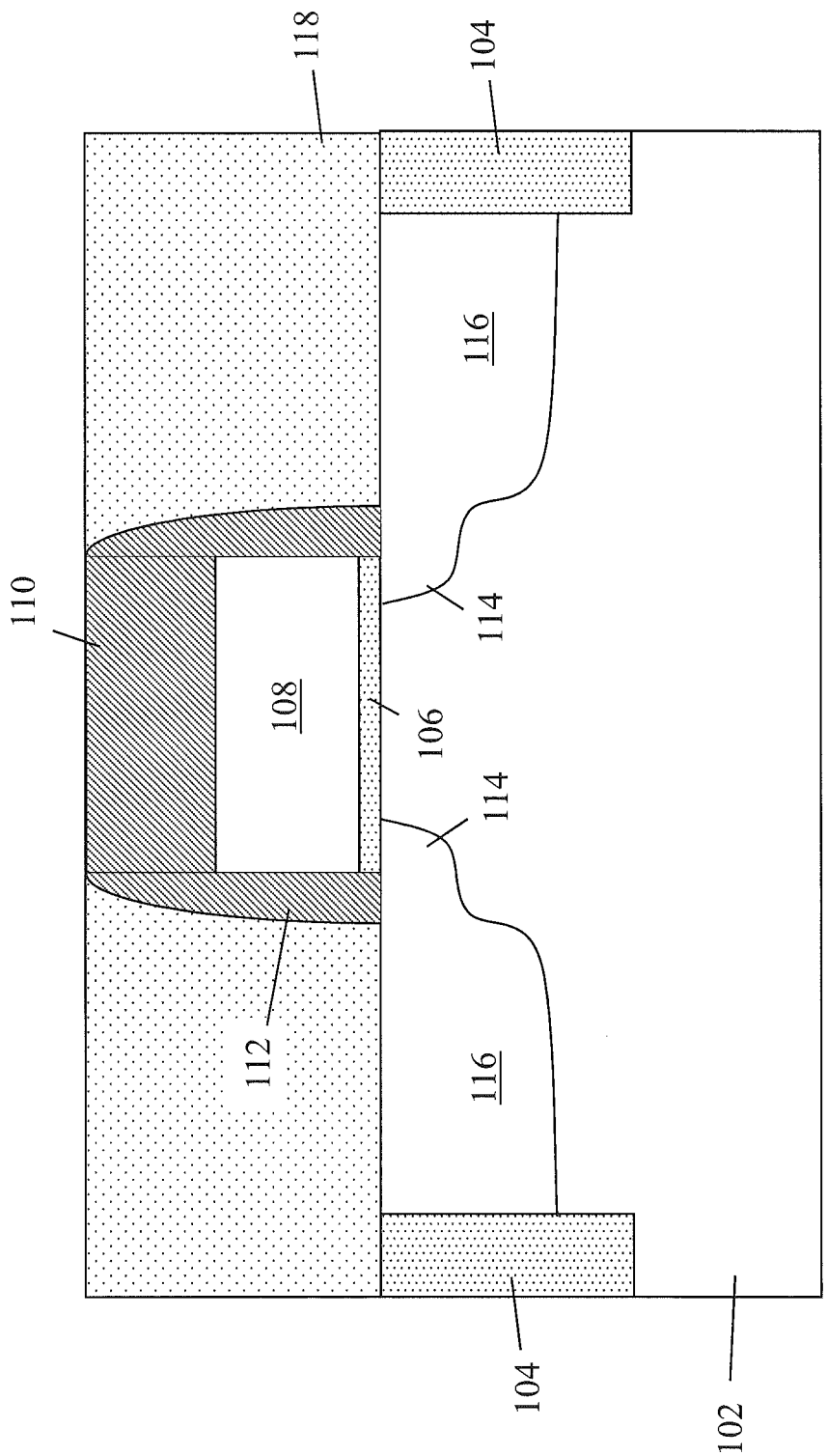
FIG. 2 illustrates the formation of an interlevel dielectric (ILD) layer over the device of FIG. 1.

FIG. 2 illustrates the formation of an interlevel dielectric (ILD) layer 118 over the device of FIG. 1. This may include, for example, a low temperature deposition of an oxide layer such as $SiO_2$. Following deposition of the oxide ILD material, the ILD layer 118 is planarized such as by chemical mechanical polishing (CMP), stopping on the dummy nitride cap layer 110. At this point, the device is ready for dummy gate removal and HKMG formation.

Figure 3:
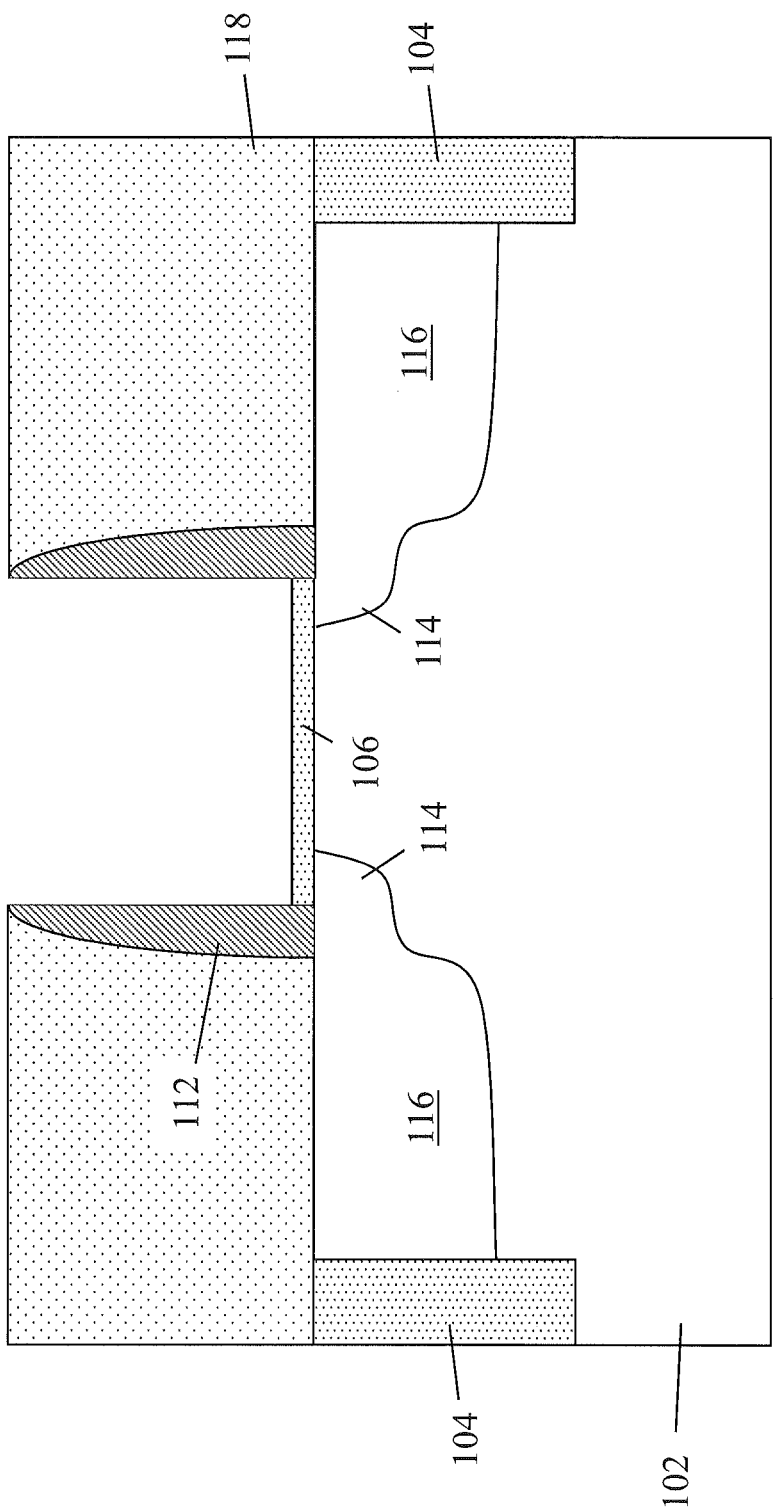
FIG. 3 illustrates removal of nitride cap and dummy polysilicon portions of the dummy gate stack structure of FIG. 2.
Figure 4:
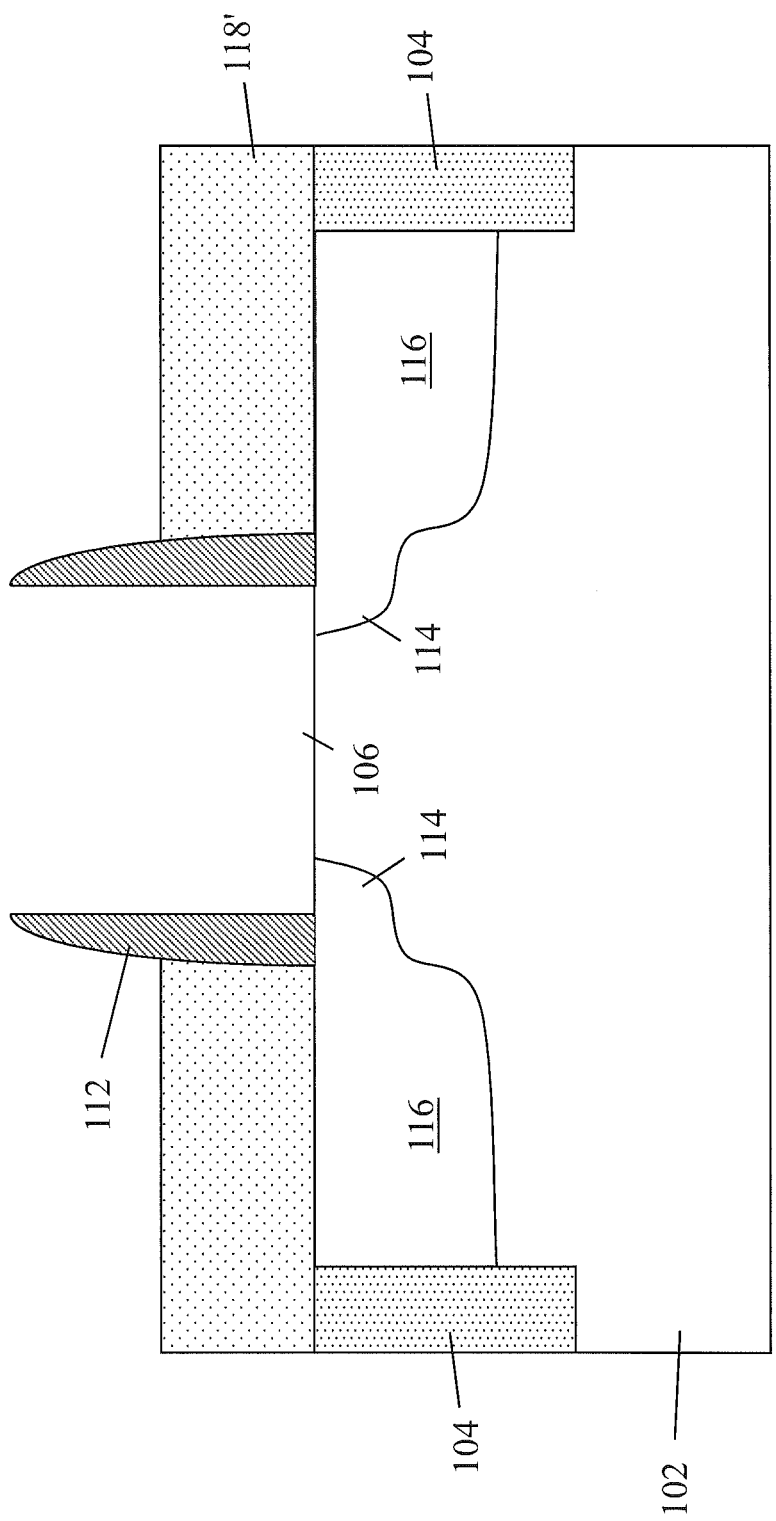
FIG. 4 illustrates removal of the dummy gate oxide portion of the dummy gate stack structure, as well as a portion of the ILD layer of FIG. 3.

Referring now to FIG. 3, the removal of nitride cap and dummy polysilicon portions of the dummy gate stack structure of FIG. 2 is illustrated. Here, suitable etch chemistries are applied so as to remove the nitride and polysilicon layers. Although not specifically depicted in FIG. 3, the directional (e.g., RIE) etch of the gate stack material (including the dummy nitride cap) may also result in a reduction in height of the sidewall spacers 112. Upon removal of the dummy polysilicon, the etch chemistry is then altered to remove the dummy gate oxide layer 106. However, as shown, in FIG. 4, due to the high etch rate of the ILD oxide material 118 (and perhaps also due to HF exposure during precleaning prior to the dummy polysilicon removal), the removal of dummy gate oxide layer may also causes a significant reduction in the height of the ILD layer, now indicated at 118'. Such a condition as depicted in FIG. 4 may lead to device problems such as final metal gate height variations, as well as device shorting.

Figure 5:
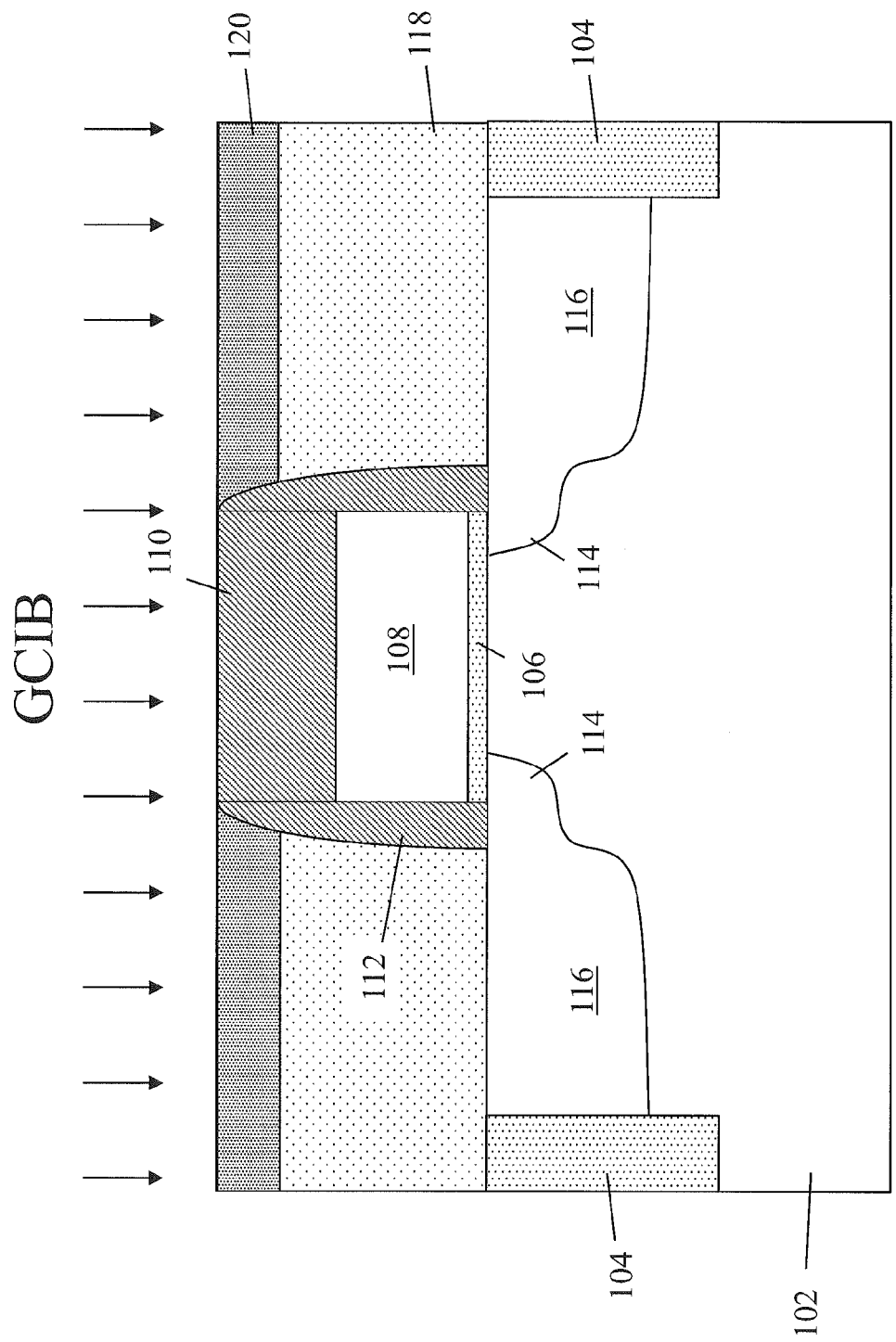
FIG. 5 illustrates the formation of a gas cluster ion beam (GCIB) layer at the top of the ILD layer prior to dummy gate stack removal, in accordance with an exemplary embodiment.

Accordingly, FIG. 5 illustrates the formation of a gas cluster ion beam (GCIB) layer 120 infused at a top portion of the ILD layer 118 prior to dummy gate stack removal, in accordance with an exemplary embodiment. In GCIB processing, a surface is bombarded by a beam of high energy, gas phase atomic clusters. The clusters are formed when a high pressure gas (e.g., 10 atmospheres) supersonically expands into a vacuum (e.g., $1 \times 10^{-5}$ Torr), cools, and then condenses into weakly ionized clusters. The ionized clusters are accelerated electrostatically to very high velocities, and are focused into a tight beam that impacts a substrate surface. As opposed to a more dispersed ion implant process, atoms of a cluster ion impact interact nearly simultaneously with the substrate atoms, which produces results such as surface smoothing, pore sealing, shallow cratering, surface chemistry alterations, thin film deposition, and shallow implantation or infusing, depending upon whether the gas clusters are inert or reactive.

A GCIB may include chemical beams of almost any species or mixture, depending on the specific objectives of the processing. Exemplary beams may include, for example, silicon (Si), nitrogen (N) or carbon (C) for film deposition, fluorine (F) for etching, and argon (Ar), N, C, or oxygen (O) for surface modification. In the embodiment depicted, a silicon species is used in the GCIB processing to form a silicon rich oxide GCIB layer 120. The silicon rich oxide GCIB layer 120 has an etch rate of about 5 times slower than that of the $SiO_2$ ILD layer 118. In addition to being a low temperature (e.g., room temperature) infusion process, the GCIB formation results in the silicon rich oxide GCIB layer 120 having a relatively shallow thickness, on the order of about 10 nm or less. This may be compared to a total ILD layer height of, for example, about 40 nm.

Figure 6:
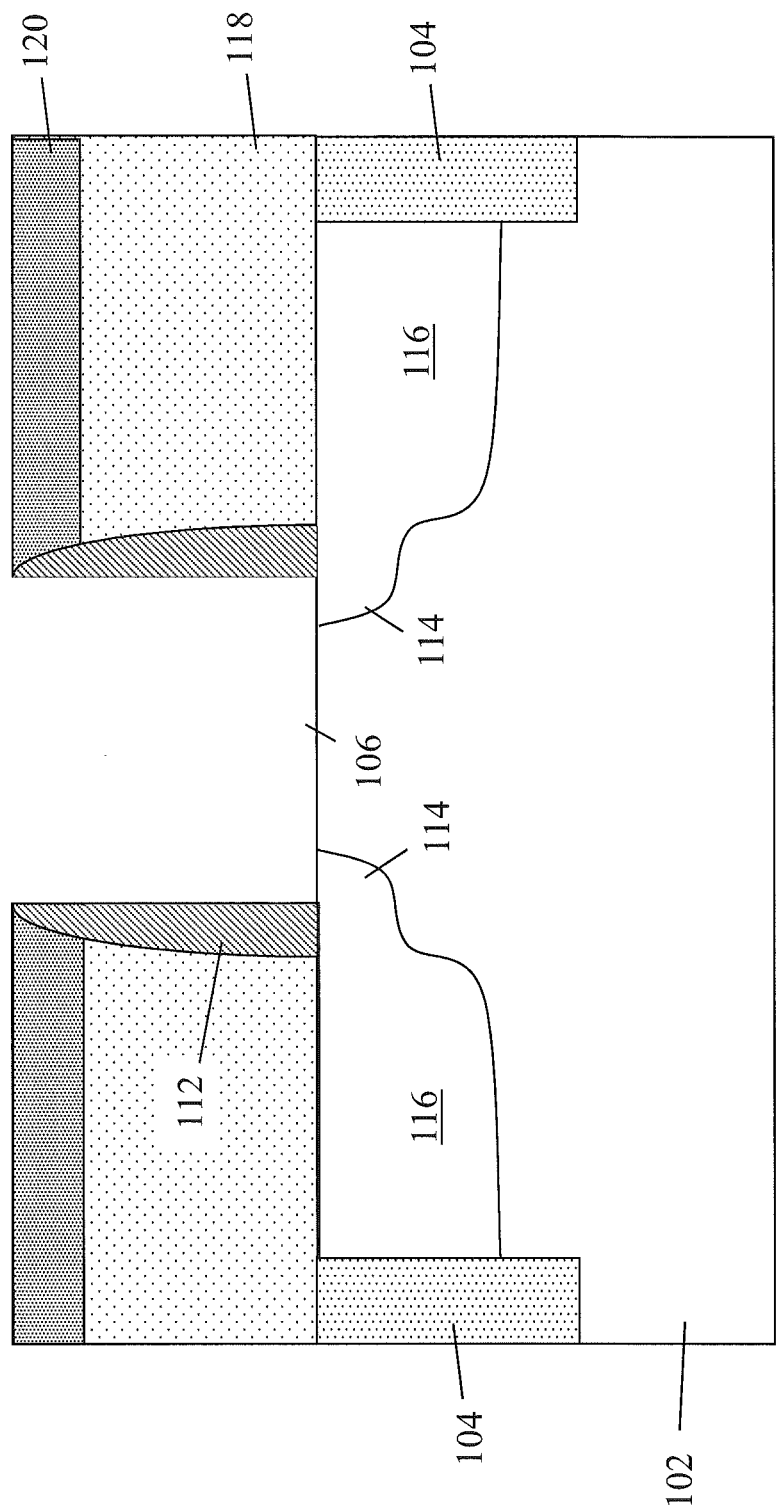
FIG. 6 illustrates the removal of the dummy gate stack structure of FIG. 5, leaving the ILD layer substantially intact.
Figure 7:
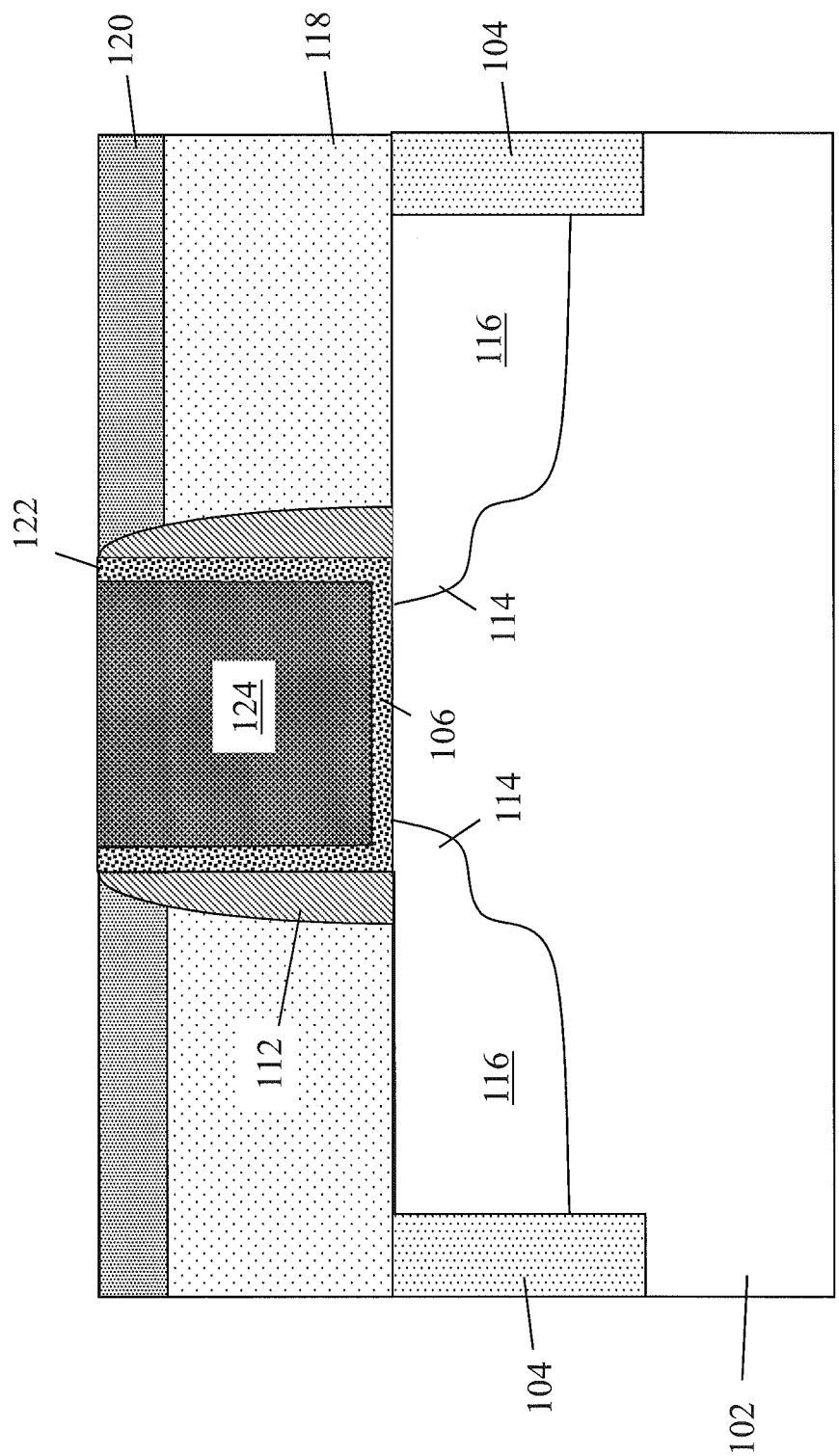
FIG. 7 illustrates the formation of a replacement metal gate structure for the device of FIG. 6.

Accordingly, as shown in FIG. 6, upon removal of the dummy gate structure, including the nitride cap, polysilicon and gate oxide layers, the more etch resistant silicon rich oxide GCIB layer 120 allows the ILD layer 118 to remain substantially intact. Finally, as shown in FIG. 7, replacement gate processing may continue as known in the art, including formation and planarization of one or more high-k gate dielectric layers 122 and metal gate layers 124. In some examples, the high-K dielectric layer 122 may include a dielectric metal oxide having a dielectric constant that is greater than the dielectric constant (7.5) of silicon nitride, and may be formed by methods well known in the art including, for example, chemical vapor deposition (CVD), ALD, molecular beam deposition (MBD), pulsed laser deposition (PLD), liquid source misted chemical deposition (LSMCD), etc. In an exemplary embodiment, the dielectric metal oxide of the high-k dielectric layer 122 includes a metal and oxygen, and optionally nitrogen and/or silicon. Specific examples of high-k dielectric materials include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 122 may be from about 1 nm to about 10 nm, and more specifically from about 1.5 nm to about 3 nm.

The metal gate layer 124, while schematically illustrated as a single layer in FIG. 7, may be a metal gate material stack that includes one or more layers of metal materials such as, for example, Al, Ta, TaN, W, WN, Ti and TiN, having an appropriate workfunction depending on whether the transistor is an NFET or a PFET device.

In one specific embodiment of an NFET device, the metal gate layer 124 may include workfunction setting metal layers selected to set the workfunction around the silicon conduction band edge. Such workfunction setting metal layers may include, for example, optional layers of about 10 Å to about 30 Å thick titanium nitride and about 10 Å to about 30 Å thick tantalum nitride, followed by a non-optional about 10 Å to about 40 Å thick layer of titanium aluminum, which together make up a workfunction setting metal layer portion of the metal gate layer 106. Alternatively, titanium aluminum nitride, tantalum aluminum, tantalum aluminum nitride, hafnium silicon alloy, hafnium nitride, or tantalum carbide may be used in the workfunction setting metal layer portion in lieu of the titanium aluminum.

In one specific embodiment of a PFET device, the metal gate layer 124 may include workfunction setting metal layers selected to set the workfunction around the silicon valence band edge. Here, such workfunction setting metal layers may include, for example, optional layers of about 10 Å to about 30 Å thick titanium nitride and about 10 Å to about 30 Å thick tantalum nitride, followed by non-optional layers of about 30 Å to about 70 Å thick titanium nitride and about 10 Å to about 40 Å thick layer of titanium aluminum, which together make up a workfunction setting metal layer portion of the metal gate layer 124. Alternatively, tungsten, tantalum nitride, ruthenium, platinum, rhenium, iridium, or palladium may be used in the workfunction setting metal layer portion in lieu of the titanium nitride and titanium aluminum nitride, tantalum aluminum, tantalum aluminum nitride, hafnium silicon alloy, hafnium nitride, or tantalum carbide may be deposited instead of the titanium aluminum. Regardless of the specific workfunction setting metal layers used in either an NFET or a PFET device, a remainder of the metal gate layer 106 may include a fill metal such as aluminum, titanium-doped aluminum, tungsten or copper.

Figure 8:
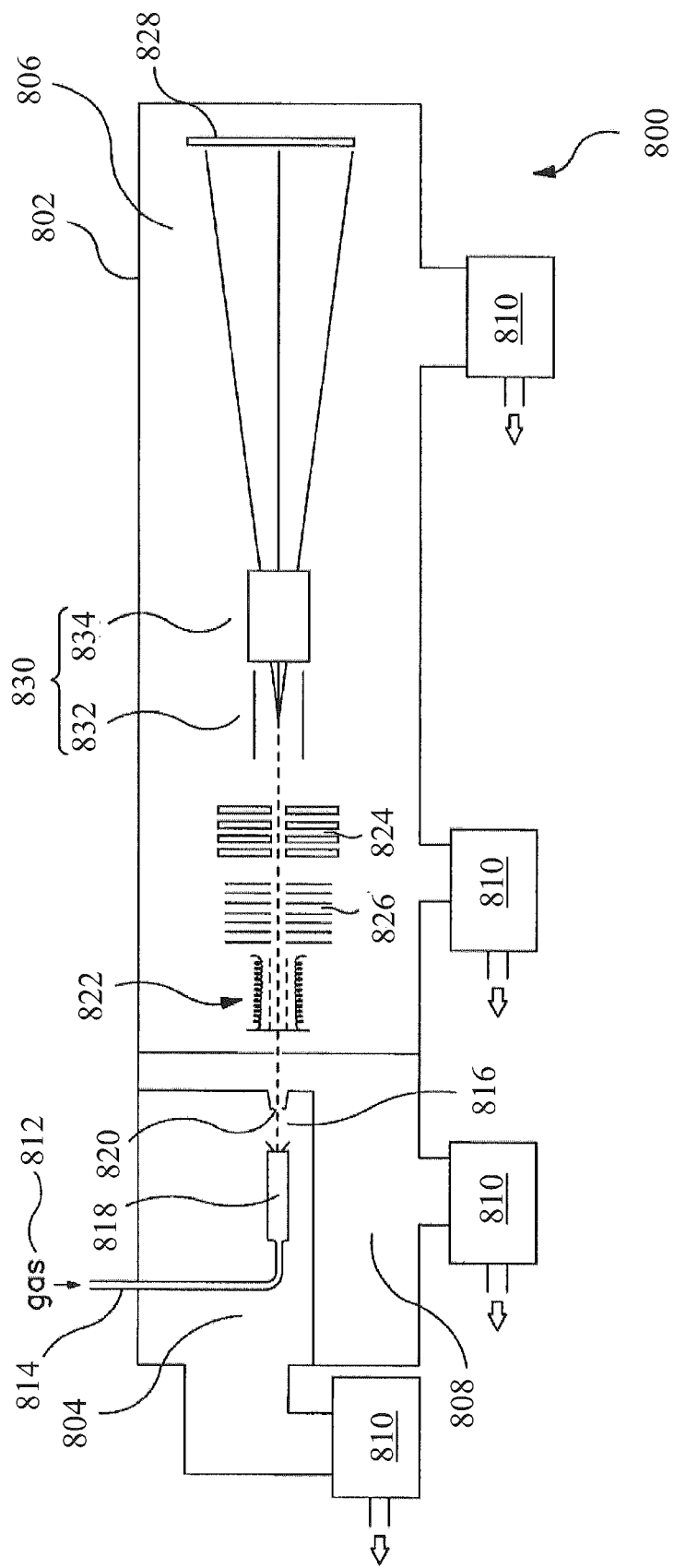
FIG. 8 illustrates an exemplary processor for performing GCIB processing.

Finally, FIG. 8 illustrates an exemplary processor 800 for performing GCIB processing as described above. The processor 800 is enclosed in a vacuum vessel 802 having a source chamber 804 and a processing chamber 806. Although not required, it may sometimes be desirable to also employ a differential vacuum pumping chamber 808 to help isolate the downstream regions from the higher pressure upstream regions. The interior of the vacuum vessel 802 is maintained at a vacuum reduced pressure by one or more vacuum pumps 810. A source gas 812 is introduced through a gas feed tube 814. Gas clusters 816 are formed by creating a supersonic jet of source gas through a properly shaped nozzle 818 into the source chamber 43, which is at a substantially reduced pressure.

Cooling resulting from the expansion causes the gas to condense into clusters of, for example, from several to several thousand atoms or molecules. A gas skimmer aperture 820 is used to separate the gas products that have not been converted into a cluster jet from the cluster jet so as to minimize pressure in the downstream regions where such higher pressures would be detrimental (e.g., ionizer 822, accelerator high voltage electrodes 824, and processing chamber 806). Suitable source gases 812 include, for example, argon, other inert gases, oxygen, nitrogen, oxygen bearing gases such as carbon dioxide, and silicon bearing gases. After the cluster jet has been formed, the clusters 816 are ionized in an ionizer 822. The ionizer 322 may be an electron impact ionizer that produces thermoelectrons from one or more incandescent filaments and accelerates and directs the electrons causing them to collide with the gas clusters 816 in the gas cluster jet where it passes through the ionizer 822. The electron impact ejects electrons from the clusters, causing the clusters to become positively ionized.

A set of suitably biased high voltage lens electrodes 826 extracts the cluster ions from the ionizer and focuses them to form a gas cluster ion beam. Another set of high voltage accelerator electrodes 824 accelerates the beam to a desired energy, for example, from 1 keV to several tens of keV. The accelerated beam is directed at a substrate 828 for GCIB processing. Although not specifically illustrated in FIG. 8, is a mass selector may be utilized for selecting clusters of a certain mass or within a certain range of masses. Such a mass selector can be, for example, a weak transverse magnetic field for deflecting monomer ions and other light ions (e.g., those cluster ions often or fewer atoms or molecules) out of the beam and passing more massive cluster ions.

Since the silicon rich layer infusion application contemplates processing of large diameter wafers with spatially uniform results, a scanning system 830 is may be used in order to uniformly scan the GCIB across large areas to produce spatially homogeneous results. In this regard, two pairs of orthogonally oriented electrostatic scan plates 832 and 834 make up scanning system 830, and having suitable beam scanning voltage waveforms imposed can be utilized to produce a raster or other scanning pattern across the desired area.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device structure, the method comprising:
    forming an interlevel dielectric (ILD) layer over a semiconductor substrate and a dummy transistor gate structure formed on the substrate;
    infusing a shallow gas cluster ion beam (GCIB) layer in a top portion of the ILD layer; and
    after infusing the GCIB layer, removing at least one layer from the dummy transistor gate structure, wherein the at least one layer comprises a same material as the ILD layer and wherein the GCIB layer has a slower etch rate with respect to the ILD layer.

2. The method of claim 1, wherein the ILD layer comprises an oxide layer.

3. The method of claim 2, wherein the at least one layer comprises a dummy gate oxide layer.

4. The method of claim 3, wherein the at least one layer comprises the dummy gate oxide layer, a dummy polysilicon layer formed on the dummy gate oxide layer, and a nitride cap layer.

5. The method of claim 4, further comprising, following removing the at least one layer, forming a replacement high-K dielectric layer and a replacement metal gate layer.

6. The method of claim 1, wherein the GOB layer is formed at about a room temperature.

7. The method of claim 1, wherein the etch rate of the GOB is about 5 times slower than that of the ILD layer.

8. The method of claim 1, wherein the GOB comprises a silicon rich oxide.

9. The method of claim 1, wherein the GOB layer has a thickness of about 10 nanometers (nm) or less.

10. The method of claim 9, wherein the ILD layer has a thickness of about 40 nm.

11. A method for forming a field effect transistor, the method comprising:
    forming a dummy gate structure over a semiconductor substrate, the dummy gate structure having sidewall spacers disposed thereon;
    forming source and drain regions in the substrate, adjacent the sidewall spacers;
    forming an interlevel dielectric (ILD) layer over a semiconductor substrate and a dummy gate structure formed on the substrate;
    infusing a shallow gas cluster ion beam (GCIB) layer in a top portion of the ILD layer; and
    after infusing the GCIB layer, removing at least one layer from the dummy transistor gate structure, wherein the at least one layer comprises a same material as the ILD layer and wherein the GCIB layer has a slower etch rate with respect to the ILD layer.

12. The method of claim 11, wherein the ILD layer comprises a deposited oxide layer.

13. The method of claim 12, wherein the at least one layer comprises a dummy gate oxide layer.

14. The method of claim 13, wherein the at least one layer comprises the dummy gate oxide layer, a dummy polysilicon layer formed on the dummy gate oxide layer, and a nitride cap layer.

15. The method of claim 14, further comprising, following removing the at least one layer, forming a replacement high-K dielectric layer and a replacement metal gate layer.

16. The method of claim 11, wherein the GOB layer is formed at about a room temperature.

17. The method of claim 11, wherein the etch rate of the GOB is about 5 times slower than that of the ILD layer.

18. The method of claim 11, wherein the GCIB comprises a silicon rich oxide.

19. The method of claim 11, wherein the GCIB layer has a thickness of about 10 nanometers (nm) or less.

20. The method of claim 19, wherein the ILD layer has a thickness of about 40 nm.

* * * * *